United States Patent
Chow et al.

(10) Patent No.: US 7,876,158 B2
(45) Date of Patent: Jan. 25, 2011

(54) HIGH GAIN STACKED CASCADE AMPLIFIER WITH CURRENT COMPENSATION TO REDUCE GAIN COMPRESSION

(75) Inventors: Yut Hoong Chow, Sungai Ara (MY); Hiang Teik Tan, Georgetown (MY)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/429,956

(22) Filed: Apr. 24, 2009

(65) Prior Publication Data

US 2010/0271134 A1  Oct. 28, 2010

(51) Int. Cl.
*H03F 3/04* (2006.01)
(52) U.S. Cl. .................. 330/288; 330/311; 330/149
(58) Field of Classification Search ......... 330/310–311, 330/149, 288; 375/296–297; 455/114.3
See application file for complete search history.

(56) References Cited

U.S. PATENT DOCUMENTS 7,656,229 B2 * 2/2010 Deng et al. ............. 330/149
2007/0030076 A1 * 2/2007 Kim et al. ............... 330/311

OTHER PUBLICATIONS

Chu, Yuan-Kai et al. "5.7GHz 0.18pm CMOS Gain-Controlled LNA and Mixer For 802.1 la WLAN Applications," 2003 IEEE Radio Frequency Integrated Circuits (RFIC) Symposium, (Jun. 2003), pp. 221-224.

Fang, Chao et al. "A 3.1-10.6 GHz Ultra-Wideband Low Noise Amplifier With 13-dB Gain, 3.4-dB Noise Figure, and Consumes Only 12.9 mW of DC Power," IEEE Microwave and Wireless Components Letters, (Apr. 2007), pp. 295-297, vol. 17, Issue 4.

Madihian, Mohammad. "A Low Power Sige GSM/DCS/WCDMA Receiver," Microwave Conference, (2006), pp. 305-308.

Li, Liang-Hui et al. "Design of a 5.7 GHZ 0.18 μm CMOS Current-Reused LNA For an 802.11A WLAN Receiver," Microwave Journal, (2004), pp. 132-136, vol. 47, No. 2.

Gao, Yuan et al. "Low-Power CMOS RF Front-end for Non-Coherent IR-UWB Receiver," Solid-State Circuits Conference, (Sep. 2008), pp. 386-389.

* cited by examiner

*Primary Examiner*—Hieu P Nguyen (57) ABSTRACT

A high gain stacked cascade amplifier includes a first amplifying element, a second amplifying element, a current mirror bias element, and a dynamic bias adjustment element. The first and second amplifying elements are coupled in series to form the high gain stacked cascade amplifier configuration. The current mirror bias element provides a bias to the first and second amplifying elements. The dynamic bias adjustment element is coupled to the second amplifying element. The dynamic bias adjustment element is configured to increase a gain compression point of a composite filter, formed by the first and second amplifying elements, in response to a determination that an input signal causes gain compression in the first amplifying element.

10 Claims, 7 Drawing Sheets

HIGH GAIN STACKED CASCADE AMPLIFIER WITH CURRENT COMPENSATION TO REDUCE GAIN COMPRESSION

BACKGROUND

High gain stacked cascade amplifiers are used to obtain very high gain for amplifying radio frequency signals by stacking and cascading MOSFET or GaAs FET/pHEMT transistors with a single voltage source and a common current that is supplied to both transistors. While the high gain stacked cascade amplifier achieves very high gain, its main drawback is the reduced output power available because each of the transistors are utilizing the same current, and each transistor can affect the gain and linearity of the other transistor.

Figure 1:
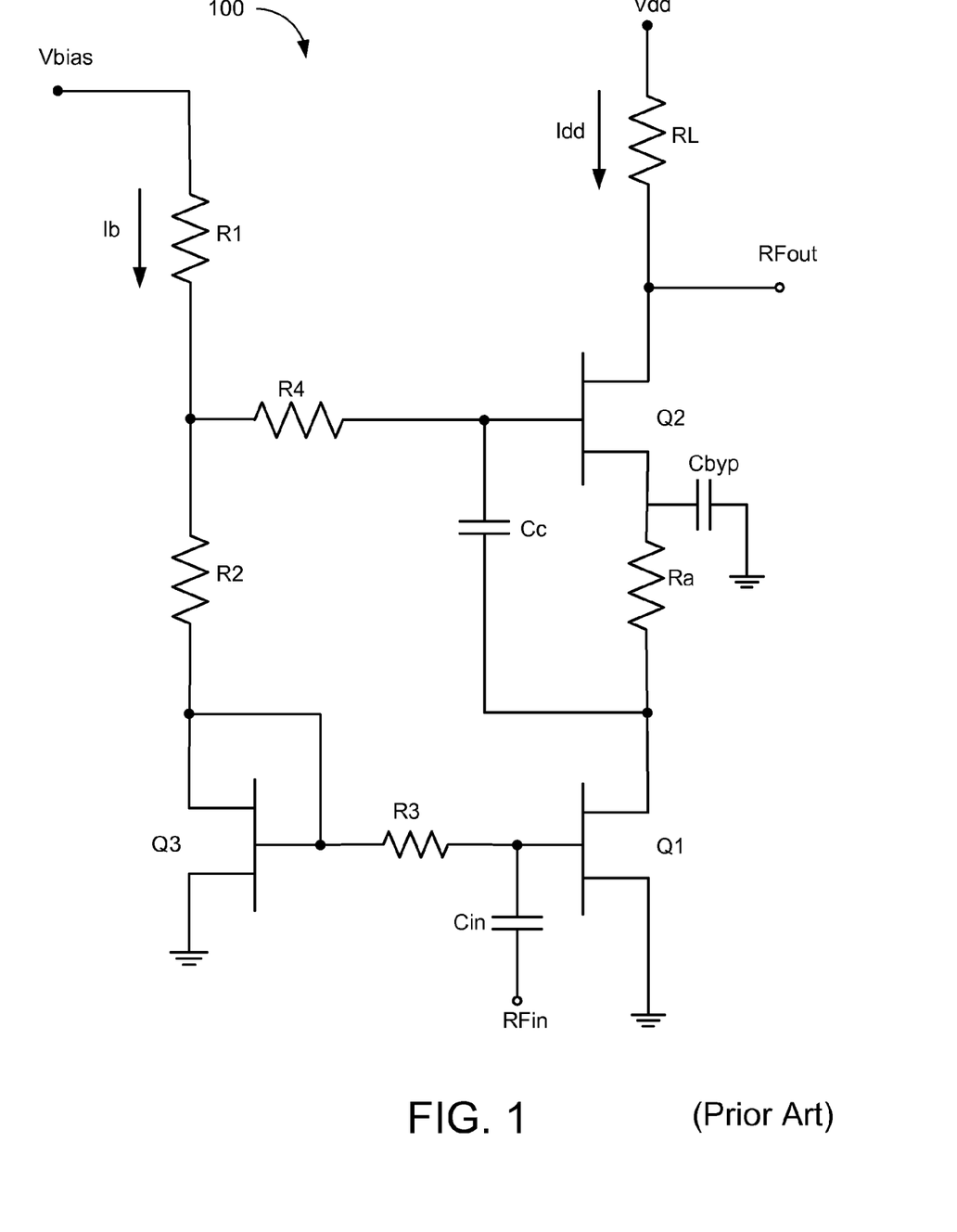
FIG. 1 depicts a schematic circuit diagram of a conventional high gain stacked cascade amplifier.

FIG. 1 depicts a conventional high gain stacked cascade amplifier 100. In the circuit depicted in FIG. 1, the output of the first amplifying element, Q1, is coupled via a coupling capacitor, Cc, to the second amplifying element, Q2. The source of the second amplifying element, Q2, is grounded by a bypass capacitor, Cbyp. The output node, RFout, of the second amplifying element, Q2, is coupled to the second amplifying element, Q2, at its drain, and the second amplifying element, Q2, has a load resistor, RL. This circuit could be extended by having more stacked amplifying elements above the second amplifying element, Q2, to enable even higher gains to be achieved. Alternatively, an inductor or a constant-current source can be used as a load element for the second amplifying element, Q2.

Since the same current, Idd, flows through both amplifying elements, Q1 and Q2, the current is the same as a single stage amplifier even though two gain stages are used as in the amplifier. The current mirror bias element, Q3, the resistor, R1, and the resistor, R2, form a current mirror bias circuit to bias the first amplifying element, Q1, and the second amplifying element, Q2.

The main drawback of the conventional circuit shown in FIG. 1 is that the output power available is reduced because of the vertical cascading and stacking of the second amplifying element, Q2, in series with the first amplifying element, Q1. While the illustrated circuit may achieve very high gain, the vertical cascading causes the dynamic range of the first amplifier element, Q1, to be diminished by the output requirements of the second amplifier element, Q2. This occurs because there is a given supply voltage, Vdd, and the second amplifier element, Q2, has a minimum voltage drop requirement across its drain and source, and there is a voltage drop across the first amplifying element, Q1, and load resistor, Ra.

Another disadvantage of the conventional high gain stacked cascade amplifier is that the first amplifying element, Q1, and the second amplifying element, Q2, oppose each other in the dynamic current requirements at large input signals. As the input signal increases, the first amplifying element, Q1, conducts more, reducing the power available to the second amplifying element, Q2, through load resistor, Ra. However, the output of the first amplifying element, Q1, reduces the output of the second amplifying element, Q2, which in turn restricts the supply current to the first amplifying element, Q1. Thus, as the input signal increases, the gain compression of the circuit increases because of the requirements of each of the two amplifiers. As a result, both the linearity and output power are degraded. Gain compression also occurs at a lower input power level compared to an amplifier with a single amplifying element.

SUMMARY

Embodiments of an apparatus are described. In one embodiment, the apparatus is a high gain stacked cascade amplifier. An embodiment of the high gain stacked cascade amplifier includes a first amplifying element, a second amplifying element, a current mirror bias element, and a dynamic bias adjustment element. The first and second amplifying elements are coupled in series to form the high gain stacked cascade amplifier configuration. The current mirror bias element provides a bias to the first and second amplifying elements. The dynamic bias adjustment element is coupled to the second amplifying element. The dynamic bias adjustment element is configured to increase a gain compression point of the composite filter, formed by the first and second amplifying elements, in response to a determination that an input signal causes gain compression in the first amplifying element. Other embodiments of the apparatus are also described.

Embodiments of a method of manufacturing a high gain stacked cascade amplifier are also described. In one embodiment, the method includes coupling first and second amplifying elements in a high gain stacked cascade amplifier configuration. The method also includes coupling a current mirror bias element to the first and second amplifying elements to bias the first and second amplifying elements. The method also includes coupling a dynamic bias adjustment element to the second amplifying element to increase a gain compression point of the composite amplifier, formed by the first and second amplifying elements, in response to a determination that an input signal causes gain compression in the first amplifying element. Other embodiments of the method of manufacturing a high gain stacked cascade amplifier are also described.

Embodiments of a method of use for a high gain stacked cascade amplifier are also described. In one embodiment, the method includes receiving a radio frequency signal at an input of a first amplifying element. The method also includes receiving an amplified signal at an input of a second amplifying element from an output of the first amplifying element. The method also includes controlling a bias on the first and second amplifying elements by utilizing a current mirror bias element. The method also includes utilizing a dynamic bias adjustment element to monitor the output of the first amplifying element to determine if a gain compression point of the composite filter, formed by the first and second amplifying elements, should be increased to reduce gain compression. Other embodiments of the method of use for a high gain stacked cascade amplifier are also described.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the embodiments describe a high gain stacked cascade amplifier that has a first amplifying element, Q1, a second amplifying element, Q2, a current mirror bias element, Q3, and a dynamic bias adjustment element, Q4. The dynamic bias adjustment element supplies additional current to the first amplifying element, Q1, and the second amplifying element, Q2, when a determination is made that an input signal, RFin, is large enough to cause gain compression in the first amplifying element, Q1. By supplying additional current in this manner, embodiments of the dynamic bias adjustment element improve the linearity and signal compression of the high gain stacked cascade amplifier compared with a conventional amplifier configuration.

Figure 2:
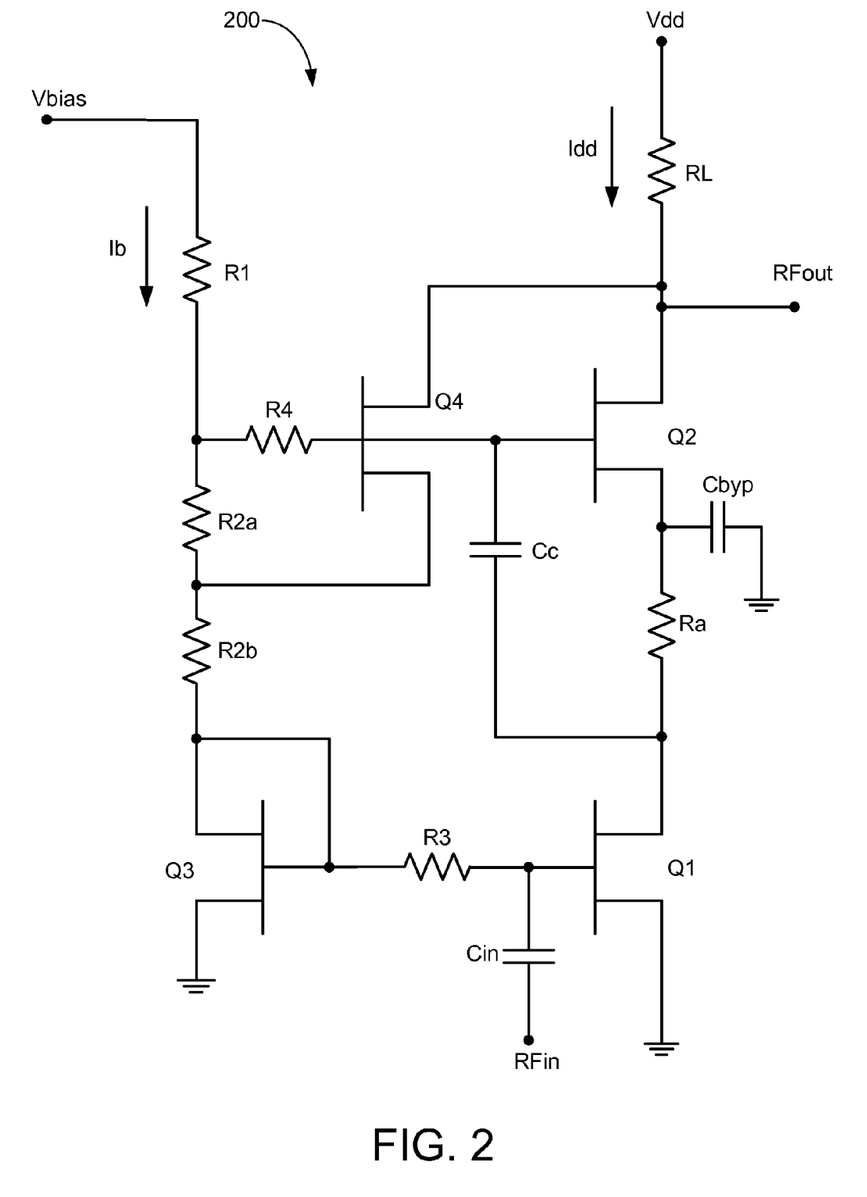
FIG. 2 depicts a schematic circuit diagram of one embodiment of a high gain stacked cascade amplifier with a dynamic bias adjustment element.

FIG. 2 depicts a schematic circuit diagram of one embodiment of a high gain stacked cascade amplifier 200 with a dynamic bias adjustment element, Q4. Although the high gain stacked cascade amplifier 200 is shown and described with certain components and functionality, other embodiments of the high gain stacked cascade amplifier 200 may include fewer or more components to implement less or more functionality.

The illustrated high gain stacked cascade amplifier 200 includes a first amplifying element, Q1, and a second amplifying element, Q2. The first and second amplifying elements, Q1 and Q2, are coupled in series in a high gain stacked cascade amplifier configuration. The high gain stacked cascade amplifier 200 also includes a current mirror bias element, Q3, configured to bias the first amplifying element, Q1, and the second amplifying element, Q2. The high gain stacked cascade amplifier 100 also includes a dynamic bias adjustment element, Q4. The dynamic bias adjustment element, Q4, is configured to increase the bias on the first amplifying element, Q1, in response to a determination that an input signal, RFin, causes gain compression in the first amplifying element, Q1.

The illustrated high gain stacked cascade amplifier 200 also includes a capacitor, Cin, which couples the input line with the gate of the first amplifying element, Q1. The high gain stacked cascade amplifier 200 also includes a capacitor, Cc, which couples the output of the first amplifying element, Q1, to the gate of the second amplifying element, Q2. The high gain stacked cascade amplifier 200 also includes a capacitor, Cbyp, which grounds the source of the second amplifying element, Q2.

The illustrated high gain stacked cascade amplifier 200 also includes a bias resistor, R1, which provides a bias to the gate of the second amplifying element, Q2, and to the gate of the dynamic bias adjustment element, Q4. The bias resistors, R2a and R2b, supply a bias for the gate of the first amplifying element, Q1. The source from the dynamic bias adjustment element, Q4, is connected to a node between the bias resistors, R2a and R2b. An alternative realization is to replace the second bias resistor, R2b. In another embodiment, a diode may be coupled in a series combination with the second bias resistor, R2b. Another resistor, R3, is an isolation resistor which connects the gate of the first amplifying element, Q1, to the drain of the current mirror bias element, Q3. Another resistor, R4, is an isolating resistor connected at one end at the node between the bias resistor, R1, and the bias resistor, R2a, and at the other end to the gate of the dynamic bias adjustment element, Q4, and the gate of the second amplifying element, Q2. Another resistor, Ra, is the load resistor for the first amplifying element, Q1, and is coupled at one end to the drain of the first amplifying element, Q1. The load resistor, Ra, is also coupled at the other end to the source of the second amplifying element, Q2. The impedance, RL, is the load impedance for the second amplifying element, Q2. In one embodiment the load impedance, RL, can be a resistor. In another embodiment, the impedance, RL, can be an inductor.

In some embodiments, the high gain stacked cascade amplifier 200 illustrated in FIG. 2 mitigates the degradation of the gain compression and linearity of the overall amplifier. In one embodiment the drain of the second amplifying element, Q2, and the drain of the dynamic bias adjustment element, Q4, are connected to the same node. Additionally, the gates of the second amplifying element, Q2, and the dynamic bias adjustment element, Q4, are connected to the same node. These connections to a common node result in a very similar change in current flowing thru the drain to source of each element as the output from the first amplifying element, Q1, is applied at the common gates of the second amplifying element, Q2, and the dynamic bias adjustment element, Q4.

Configuring embodiments of the high gain stacked cascade amplifier 200 with a dynamic bias adjustment element, Q4, has two effects. First, implementing the high gain stacked cascade amplifier 200 with a dynamic bias adjustment element, Q4, stabilizes the bias of the current mirror bias element, Q3, against large signal variations. Second, implementing the high gain stacked cascade amplifier 200 with a dynamic bias adjustment element, Q4, dynamically increases current to the current mirror bias element, Q3, when the input signal, RFin, increases. Increasing the current to the current mirror bias element, Q3, increases the dynamic bias to the first amplifying element, Q1, thereby reducing the gain compression effect. Additionally, increasing the current to the current mirror bias element, Q3, improves linearity of the whole amplifier. In one embodiment the dynamic bias adjustment element, Q4, is sized so that the quiescent current of the dynamic bias adjustment element, Q4, is very low and, furthermore, the dynamic bias adjustment element, Q4, conducts just enough to dynamically bias the first amplifying element, Q1, and the second amplifying element, Q2, when the input signal is large enough to cause gain compression.

In one embodiment the first amplifying element, Q1, and the second amplifying element, Q2, can be manufactured using CMOS enhancement-mode technologies. In another embodiment the first amplifying element, Q1, and second amplifying element, Q2, can be manufactured using GaAs enhancement-mode technologies. In further embodiments, the complete circuit of the high gain stacked cascade amplifier 200 may be manufactured using CMOS or GaAs technologies.

Figure 3:
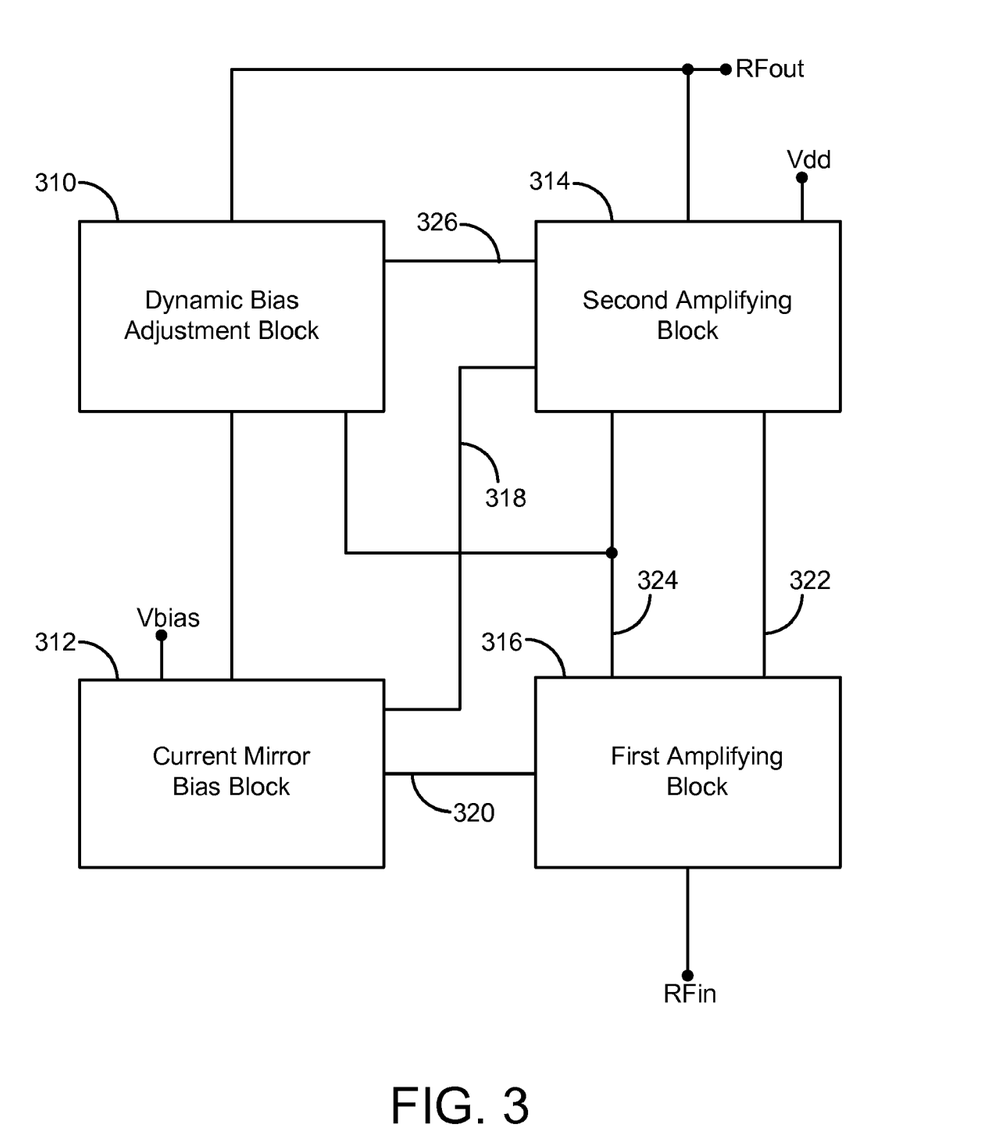
FIG. 3 depicts a schematic block diagram of the high gain stacked cascade amplifier of FIG. 2.

FIG. 3 depicts schematic a block diagram of the high gain stacked cascade amplifier 200 of FIG. 2. For reference, each of the blocks 310, 312, 314, and 316 shown in FIG. 3 corresponds to one or a combination of components shown in FIG. 2 and described above. In particular, the dynamic bias adjustment block 310 includes the dynamic bias adjustment element, Q4. The current mirror bias block 312 includes the biasing resistors, R1, R2a, and R2b, and the current mirror bias element, Q3. The second amplifying block 314 includes the second amplifying element, Q2, the grounding bypass capacitor, Cbyp, the load resistor, RL, and the blocking resistor, R4. The first amplifying block 316 includes the first amplifying element, Q1, the signal input coupling capacitor, Cin, the blocking resistor, R3, the load resistor, Ra, and the first amplifying output coupling capacitor, Cc. The various blocks 310, 312, 314, and 316 are coupled together by a plurality of connections 318, 320, 322, 324, and 326, which may be individual conductive wires, or lines, or another type of communication channel.

In general, the first amplifying block 316 receives the input signal, RFin, to be amplified. The output of the first amplifying block 316 is coupled via the connection 322 to the input of the second amplifying block 314, which further amplifies the input signal, RFin, after it is amplified by the first amplifying block 316. The first and second amplifying blocks 316 and 314 are biased by the current mirror bias block 312 through connections 318 and 320.

The dynamic bias adjustment block 310 monitors the output of the first amplifying block 316 through connection 324. Also, the dynamic bias adjustment block is coupled to the second amplifying block 312. The dynamic bias adjustment block 310 causes the bias on the connections 320 and 314 to increase in response to a determination that the input signal, RFin, causes gain compression in the first amplifying block 316.

Figure 4:
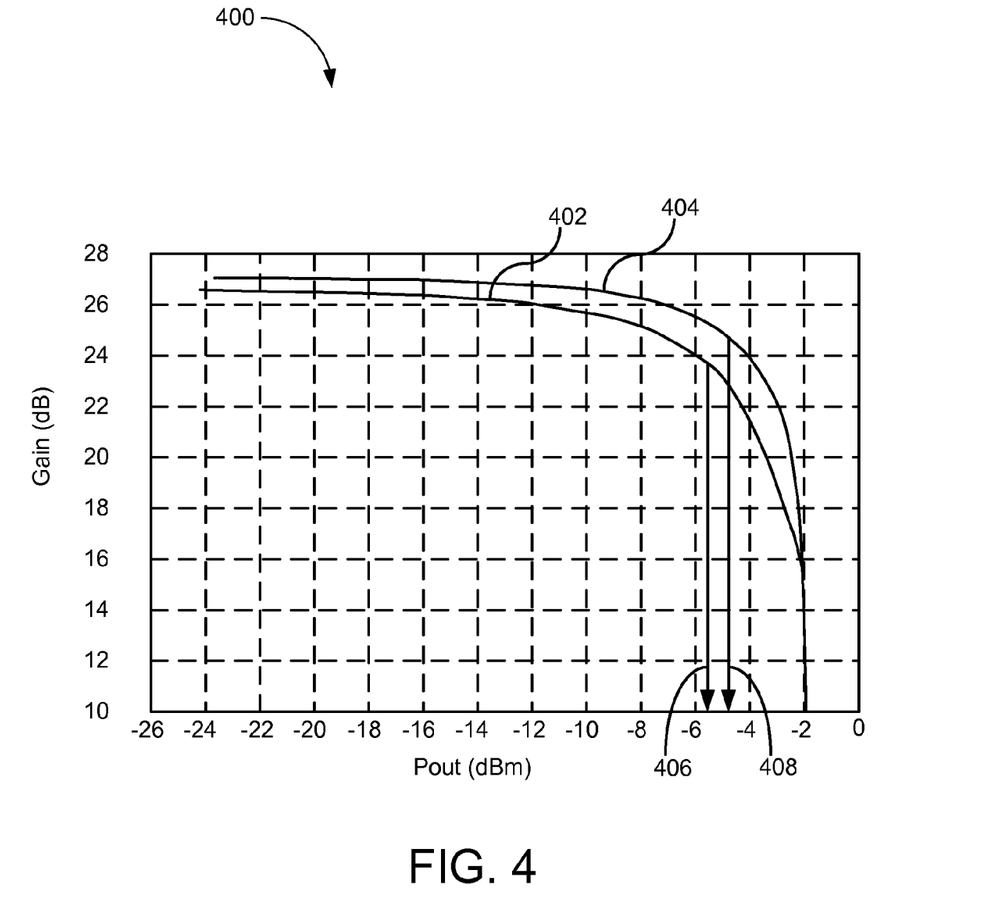
FIG. 4 depicts a graph showing an improvement in compression point for an embodiment of the high gain stacked cascade amplifier of FIG. 2.

FIG. 4 depicts a graph 400 showing an improvement in compression point for the embodiment of an embodiment of the high gain stacked cascade amplifier of FIG. 2. In particular, the graph 400 illustrates a chart which indicates the gain in decibels (dB) as a function of the power out referenced to one milliwatt (dBm). The bottom curved line 402 depicts a plot of the gain versus power out for a conventional high gain amplifier 100. The top curved line 404 is the plot of the gain versus power out for an embodiment of the high gain stacked cascade amplifier 200. The lines 406 and 408 drawn down to the Pout (dBm) axis depict one example of improvement of power out, Pout, for a given gain of one dBm for the high gain stacked cascade amplifier 200 of FIG. 2 (see line 408) compared with a conventional high gain stacked cascade amplifier 100 (see line 406).

Figure 5:
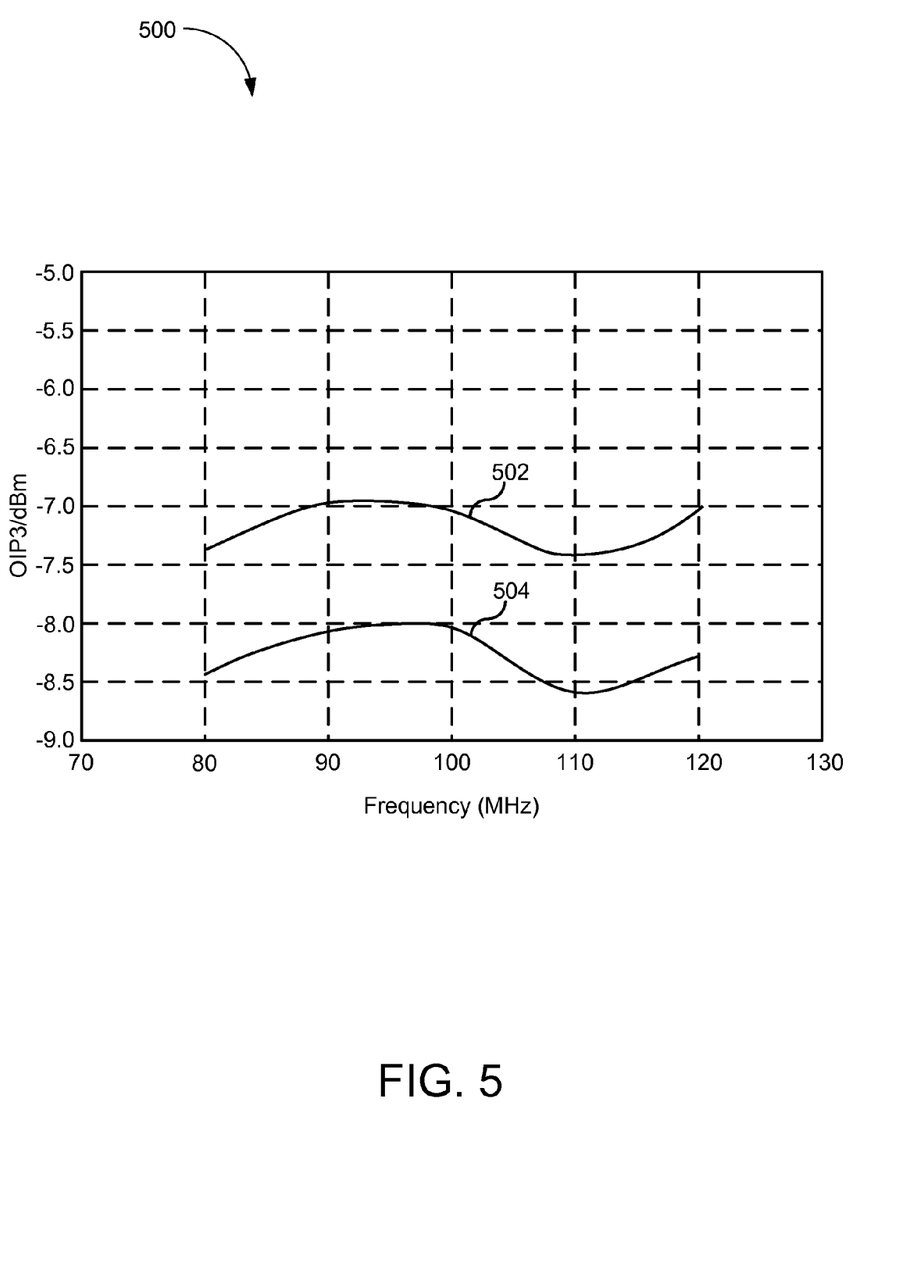
FIG. 5 depicts a graph showing the third order intercept point of inter-modulation distortion (OIP3) for the high gain stacked cascade amplifier of FIG. 2 compared with a conventional high gain stacked cascade amplifier.

FIG. 5 depicts a graph 500 showing the third order intercept point of inter-modulation distortion (OIP3) for the high gain stacked cascade amplifier 200 of FIG. 2 compared with a conventional high gain stacked cascade amplifier 100. In particular, the graph 500 illustrates a chart depicting one example of improvement in the OIP3 in dBm as a function of frequency in megahertz. The plot 502 for the improved high gain stacked cascade amplifier 200 shows about a 1 dBm improvement over the complete frequency range when compared to the same plot 504 for a conventional high gain stacked cascade amplifier 100. Other embodiments may exhibit more or less improvement, in various aspects, compared with conventional high gain stacked cascade amplifiers.

Figure 6:
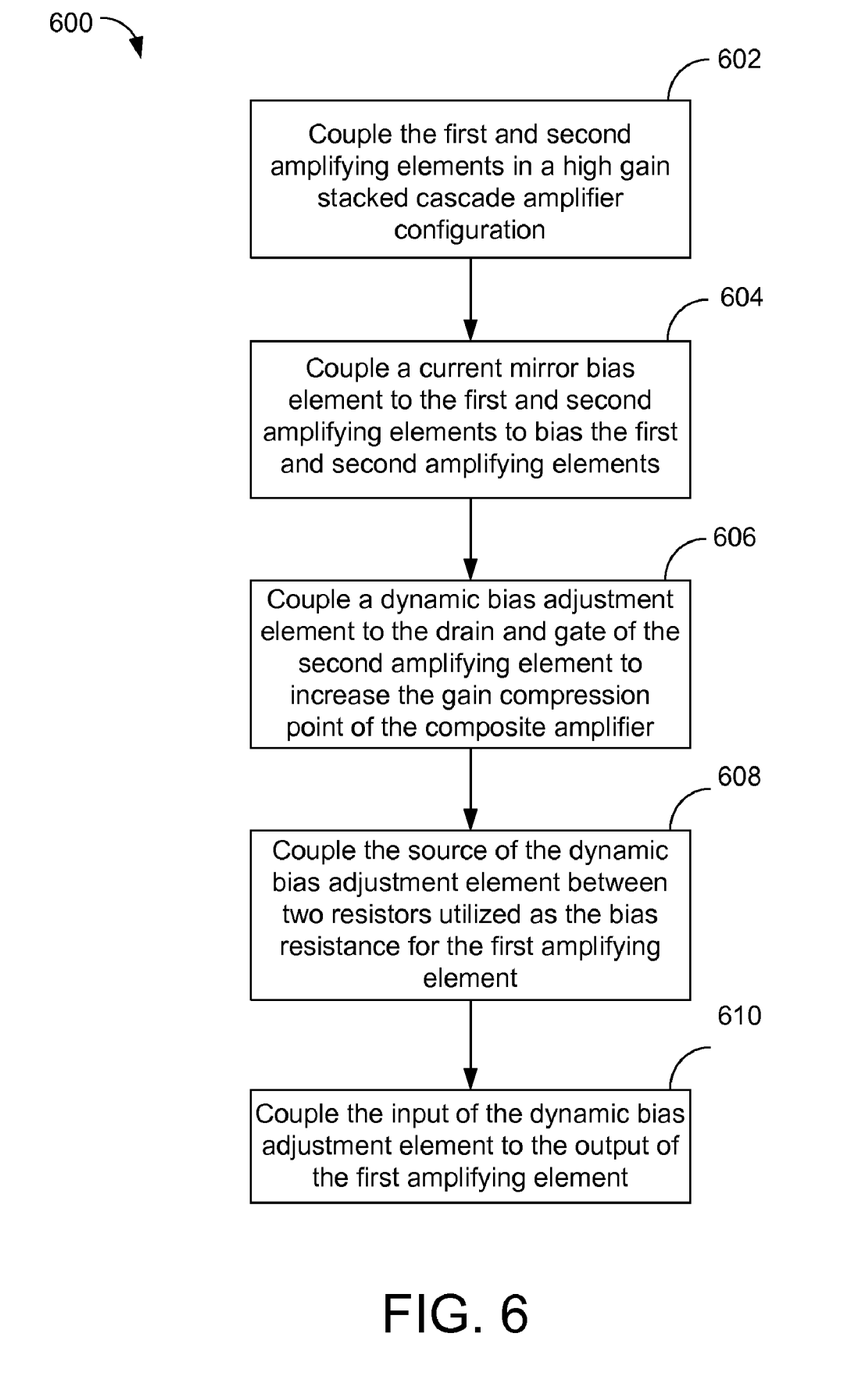
FIG. 6 depicts a flow diagram of one embodiment of a method of manufacturing a high gain stacked cascade amplifier with gain compression compensation.

FIG. 6 depicts a flow chart diagram of one embodiment of a method 600 of manufacturing a high gain stacked cascade amplifier 200 with gain compression compensation. Although the method 600 is described in conjunction with the high gain stacked cascade amplifier 200 and the dynamic bias adjustment element, Q4, of FIG. 2, embodiments of the method 600 may be implemented with other types of high gain stacked cascade amplifier and/or dynamic bias adjustment elements.

At block 602, the first and second amplifying elements, Q1 and Q2, are coupled in a high gain stacked cascade amplifier configuration. At block 604, the current mirror bias element, Q3, is coupled to the first and second amplifying elements, Q1 and Q2, to bias the first and/or second amplifying elements, Q1 and Q2. At block 606, the drain and gate of the dynamic bias adjustment element, Q4, are coupled to the drain and gate, respectively, of the second amplifying element, Q2, to increase the gain compression point of the composite filter, formed by the first and second amplifying elements, Q1 and Q2, when a determination is made that the input signal, RFin, is high enough to cause gain compression. At block 608, the source of the dynamic bias adjustment element, Q4, is coupled to a node between the bias resistors, R2a and R2b, for the first amplifying element, Q1. At block 610, the gate of the dynamic bias adjustment element, Q4, is coupled to the output of the first amplifying element, Q1. The depicted method 600 then ends.

Figure 7:
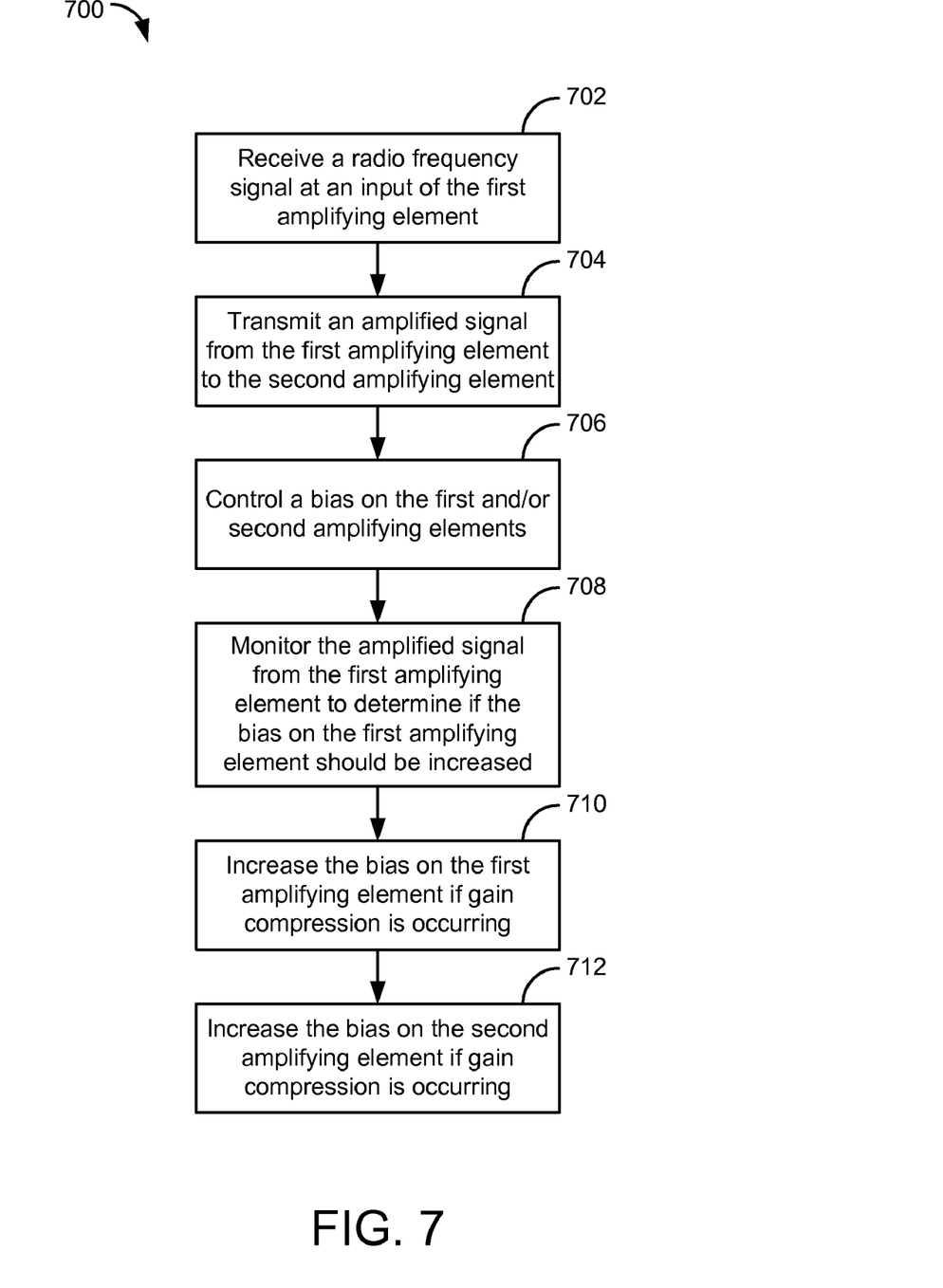
FIG. 7 depicts a flow diagram of one embodiment of a method of use for a high gain stacked cascade amplifier with gain compression compensation.

FIG. 7 depicts a flow chart diagram of one embodiment of a method 700 of use for a high gain stacked cascade amplifier 200 with gain compression compensation. Although the method 700 is described in conjunction with the high gain stacked cascade amplifier 200 and the dynamic bias adjustment element, Q4, of FIG. 2, embodiments of the method 700 may be implemented with other types of high gain stacked cascade amplifier and/or dynamic bias adjustment elements.

At block 702, the first amplifying element, Q1, receives a radio frequency signal, RFin. The first amplifying element, Q1, amplifies the received radio frequency signal, RFin. At block 704, the first amplifying element, Q1, transmits the amplified radio frequency signal to the second amplifying element, Q2, which amplifies the radio frequency signal further. At block 706, a current mirror element, Q3, provides a bias to the first and second amplifying elements, Q1 and Q2. At block 708, dynamic bias adjustment element, Q4, monitors the output of the first amplifying element, Q1, to determine if the bias on the first amplifying element, Q1, should be increased. At block 710, the current mirror bias element, Q3, supplies additional current to the first amplifying element, Q1, to increase the bias on the first amplifying element, Q1, if gain compression is occurring. Similarly, at block 712, the current mirror bias element, Q3, supplies additional current to the second amplifying element, Q2, to increase the bias on the second amplifying element, Q2, if gain compression is occurring. In another embodiment, the current mirror bias element, Q3, only supplies additional current to the either the first amplifying element, Q1, or the second amplifying element, Q2, but not to both amplifying elements. The depicted method 700 then ends.

Some embodiments of the high gain stacked cascade amplifier 200 with a dynamic bias adjustment element, Q4, provide advantages over conventional amplifier configurations. When an input signal introduced to the first amplifier element, Q1, causes gain compression on the output of the first amplifier element, Q1, the dynamic bias adjustment element, Q4, increases the bias on the first amplifier element, Q1, to reduce the gain compression. Also, the overall linearity of the amplifier configuration is improved because the gain compression is reduced.

Also, embodiments of the high gain stacked cascade amplifier 200 are high gain, high frequency amplifiers that can be used in a variety of high frequency applications. For example, embodiments of the high gain stacked cascade amplifier 200 may be implemented in communication technologies utilize high frequency signals often in the 2-5 GHz range. Embodiments of the high gain stacked cascade amplifier 200 provide dependable high frequency amplification while improving linearity by reducing gain compression when amplifying high frequency signals.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A high gain stacked cascade amplifier comprising:
a first amplifying element;
a second amplifying element coupled in series with the first amplifying element within a high gain stacked cascade amplifier configuration, wherein an output of the first amplifying element is coupled to an input of the second amplifying element;
a current mirror bias element coupled to the first and second amplifying elements, wherein the current mirror bias element is configured to bias the first and second amplifying elements; and
a dynamic bias adjustment element coupled to the second amplifying element, the dynamic bias adjustment element configured to increase a gain compression point of a composite filter, formed by, the first and second amplifying elements, in response to a determination that an input signal of the first amplifying element causes gain compression in the first amplifying element.

2. The high gain stacked cascade amplifier of claim 1, further comprising a capacitor coupled between the output of the first amplifying element and the input of the second amplifying element, wherein the capacitor is configured to convey an amplified signal from the output of the first amplifying element to the input of the second amplifying element.

3. The high gain stacked cascade amplifier of claim 1, further comprising a bypass capacitor coupled to a source of the second amplifying element, the bypass capacitor to ground the source of the second amplifying element.

4. The high gain stacked cascade amplifier of claim 1, wherein the second amplifying element comprises an impedance load, wherein the impedance load comprises a resistor.

5. The high gain stacked cascade amplifier of claim 1, wherein the second amplifying element comprises an impedance load, wherein the impedance load comprises an inductor.

6. The high gain stacked cascade amplifier of claim 1, wherein the first and second amplifying elements comprise CMOS enhancement-mode transistors.

7. The high gain stacked cascade amplifier of claim 1, wherein the first and second amplifying elements comprise GaAs enhancement-mode transistors.

8. A method of manufacturing a high gain stacked cascade amplifier, the method comprising:
coupling first and second amplifying elements in a high gain stacked cascade amplifier configuration;
coupling a current mirror bias element to the first and second amplifying elements to bias the first and second amplifying elements;
coupling a dynamic bias adjustment element to the second amplifying element to increase a gain compression point of a composite amplifier, formed by the first and second amplifying elements, in response to a determination that an input signal of the first amplifying element causes gain compression in the first amplifying element; and
coupling an output of the first amplifying element to an input of the dynamic bias adjustment element.

9. The method of claim 8, further comprising coupling a source of the dynamic bias adjustment element between two resistors of a bias resistance to bias the first amplifying element.

10. The method of claim 8, further comprising coupling a capacitor to an input of the first amplifying element, wherein the capacitor is configured to convey an input signal to the input of the first amplifying element.

* * * * *